(12) United States Patent
Lin

(10) Patent No.: US 6,566,192 B2
(45) Date of Patent: May 20, 2003

(54) METHOD OF FABRICATING A TRENCH CAPACITOR OF A MEMORY CELL

(75) Inventor: Shian-Jyh Lin, Chiayi Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/071,064

(22) Filed: Feb. 7, 2002

(65) Prior Publication Data

US 2002/0119621 A1 Aug. 29, 2002

(30) Foreign Application Priority Data

Feb. 27, 2001 (TW) ........................................ 90104623 A

(51) Int. Cl.⁷ .......................................... H01L 21/8242
(52) U.S. Cl. ...................... 438/243; 438/249; 438/392
(58) Field of Search .......................... 438/3, 240, 243, 438/244, 245, 246, 247, 249, 386, 387, 388, 389, 392; 257/301

(56) References Cited

U.S. PATENT DOCUMENTS

| | | | | |
|---|---|---|---|---|
| 5,380,674 A | * | 1/1995 | Kimura et al. | 438/241 |
| 6,096,598 A | * | 8/2000 | Furukawa et al. | 438/249 |
| 6,297,086 B1 | * | 10/2001 | Hegde et al. | 438/243 |
| 6,316,310 B1 | * | 11/2001 | Wensley et al. | 438/249 |
| 6,365,485 B1 | * | 4/2002 | Shiao et al. | 438/392 |
| 6,426,254 B2 | * | 7/2002 | Kudelka et al. | 438/246 |

* cited by examiner

Primary Examiner—Tuan H. Nguyen
(74) Attorney, Agent, or Firm—Ladas & Parry

(57) ABSTRACT

A method of fabricating a trench capacitor of a memory cell. A pad layer is formed on the substrate, and a deep trench is then formed. A residual first insulating layer is conformably formed on the sidewall and bottom of the trench, wherein the upper surface of the residual first insulating layer is lower than that of the substrate. A residual non-doped layer is conformably formed on the first insulating layer, wherein the upper surface of the residual non-doped layer is between the upper surfaces the residual first insulating layer and the substrate. A residual doped insulating layer is conformably formed on the residual non-doped layer, wherein the upper surface of the residual doped insulating layer is substantially level with that of the residual non-doped layer. A second insulating layer is conformably formed on the pad layer and the inner surface of the trench. A drive-in process is performed to drive the ions in the residual doped insulating layer into the residual non-doped layer to form a bottom electrode. The residual doped insulating layer and the second insulating are removed in sequence. A dielectric layer and a top electrode are formed in sequence to complete the fabrication of the trench capacitor of a memory.

22 Claims, 15 Drawing Sheets

METHOD OF FABRICATING A TRENCH CAPACITOR OF A MEMORY CELL

BACKGROUND OF THE INVENTION

1. Field of the Invention

The present invention relates to a method of fabricating a semiconductor device and, more particularly, to a method of fabrication of a trench capacitor of a memory cell.

2. Description of the Related Art

A dynamic random access memory (DRAM) cell includes a metal-oxide-semiconductor field effect transistor (MOSFET) and a capacitor that are built in a semiconductor silicon substrate. There is an electrical contact between the drain of a MOSFET and the bottom storage electrode of the adjacent capacitor to form a memory cell of the DRAM device.

In recent years, the sizes of the MOSFETs have shrunk to increase the packing densities of DRAM devices. For example, new techniques for manufacturing extremely small capacitors have been developed for 1 Giga bit DRAMs and beyond. One of the methods of increasing integration is to form a very deep trench capacitor structure, instead of the commonly used stack capacitor.

In FIG. 1A, a semiconductor substrate 100 is provided. A pad oxide layer 102 with thickness of about 200 angstroms is formed on the substrate 100 by oxidation. Subsequently, a pad nitride layer 106 with thickness of about 1600 angstroms is formed on the pad oxide 102 by low-pressure chemical vapor deposition (LPCVD). The pad oxide 102 and the pad nitride 104 constitute the pad layer 107. A first masking layer 108 such as boron-silicate glass (BSG) with thickness of 5000 angstroms is formed on the pad layer 107 by CVD.

In FIG. 1B, the first masking layer 108 is defined and as a mask to dry etch the pad layer 107 and the substrate 100 to form a deep trench 112 with depth of about 6 micron meters. Subsequently, the pad layer 107 is used as a stop layer to remove the first masking layer 108 by isotropic etching.

In FIG. 1C, a doped insulating layer 120 such as an arsenic-silicate glass (ASG) with thickness of 50 to 400 angstroms conformably covers the pad layer 107 and the sidewall and the bottom of the deep trench 112 by in-situ arsenic doped LPCVD. Subsequently, a first photoresist (PR) layer (not shown) is filled into the deep trench 112. The upper portion of the first photoresist layer is removed by PR stripping, and the remaining first photoresist layer is represented as the residual first photoresist layer 125'.

In FIG. 1D, the doped insulating layer 120 on the pad layer 107 and above the residual first photoresist layer 125' in the deep trench 112 is removed by isotropic etching, and the remaining doped insulating layer 120 is represented as a residual doped insulating layer 120'. Thereafter, the residual first photoresist layer 125' is removed. An insulating layer 128 such as tetraethyl orthosilicate (TEOS) oxide with thickness of 50 to 500 angstroms conformably covers the pad layer 107, sidewall of the deep trench 112 and surface of the residual doped insulating layer 120' by LPCVD.

In FIG. 1E, after a drive-in process is performed, the arsenic ions in the residual doped insulating 120' are driven into the substrate 100 to form a junction with depth of about 800 angstroms as a bottom electrode 130. Afterwards, the insulating layer 128 and the residual doped insulating layer 120' are removed. A dielectric layer 140 is formed on the surface of the bottom electrode 130, and a conductive layer (not shown) such as a polycrystalline silicon in-situ doped with arsenic ions or phosphorus ions is then fully filled in the deep trench 112. A portion of the conductive layer in the deep trench 112 is removed, and a portion of the conductive layer surrounded by the dielectric layer 140 remains to form a top electrode 150. Accordingly, the manufacture of the trench capacitor of a memory cell is completed.

In FIG. 1F, the substrate 100 is bombarded by plasma to form the deep trench 112 during the anisotropic etching. Many sidewall pockets 160 are formed on the sidewall of the deep trench 112 because of the dislocation of crystals on the sidewall of the deep trench 112 during the bombardment process. Sidewall pockets 160 easily give rise to current leakage. In addition, since the packing density of the DRAM device is increased and the size of the MOSFET is shrunk, the current leakage of the DRAM device caused by sidewall pockets 160 cannot be ignored. Therefore, it is very important to improve the sidewall pockets in the manufacturing processes to reduce current leakage for DRAM devices.

SUMMARY OF THE INVENTION

Accordingly, an object of the present invention is to provide a method of fabricating a trench capacitor of a semiconductor memory device to prevent current leakage from the capacitor.

Before forming a trench capacitor, a deep trench is formed by anisotropic etching. During the etching, the plasma bombards the sidewall of the deep trench. Many sidewall pockets are formed on the sidewall of the deep trench because of the dislocation on the exposed surface of the substrate. These sidewall packets give rise to current leakages and subsequent DRAM device failure. According to this invention, a new method of fabricating a trench capacitor of a semiconductor memory device can prevent the formation of the sidewall pockets to avoid the current leakage.

In order to achieve the above object, the method of the present invention for fabricating a trench capacitor includes the following steps. At first, a semiconductor substrate with a surface covered by a pad layer is provided. A trench is formed in the substrate. A first insulating layer is conformably formed on the pad layer and the surface of the trench. A portion of the first insulating layer is then removed to form a residual first insulating layer, wherein the upper surface of the residual first insulating layer is lower than that of the substrate. A non-doped layer is conformably formed on the pad layer, the exposed surface of the substrate and the surface of the residual first insulating layer. A portion of the non-doped layer is then removed to form a residual non-doped layer, wherein the upper surface of the residual non-doped layer is between the upper surfaces of the residual first insulating layer and the substrate. A doped insulating layer is conformably formed on the pad layer, the exposed surface of the substrate and the surface of the residual non-doped layer. A portion of the doped insulating layer is then removed to form a residual doped insulating layer, wherein the upper surface of the residual doped insulating layer is substantially level with that of the residual non-doped layer and the substrate. A second insulating layer is conformably formed on the pad layer, the exposed surfaces of the substrate and the residual non-doped layer and the surface of the residual doped layer. A drive-in process is performed to drive the ions in the residual doped insulating layer into the residual non-doped layer to form a bottom electrode. The residual doped insulating layer and the second insulating are then removed in sequence. A dielectric layer is conformably formed on the sidewall and bottom of the bottom electrode. A conductive layer is then formed on the pad layer and in the trench. Finally, a portion of the conductive layer is removed to form a top electrode, wherein the upper surface of the top electrode is substantially level with that of the dielectric layer. In addition, the first insulating layer is oxide silicon formed by LPCVD.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The invention disclosed herein is directed to a method of fabricating a trench capacitor of a DRAM. In the following description, numerous details are set forth in order to provide a thorough understanding of the present invention. It will be appreciated by those skilled in the art that variations of these specific details are possible while still achieving the results of the present invention. Well-known processing steps are not described in detail in order not unnecessarily to obscure the present invention.

Figure 1A:
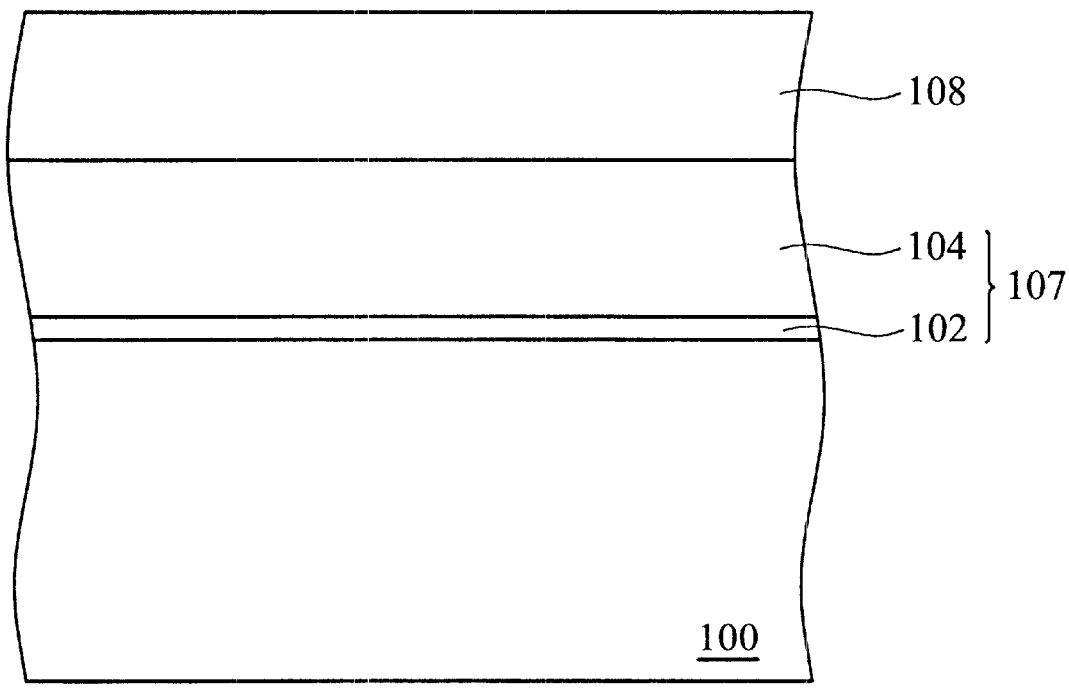
FIGS. 1A to 1E are sectional diagrams showing a method of fabricating a trench capacitor of a DRAM cell according to the prior art.
Figure 1B:
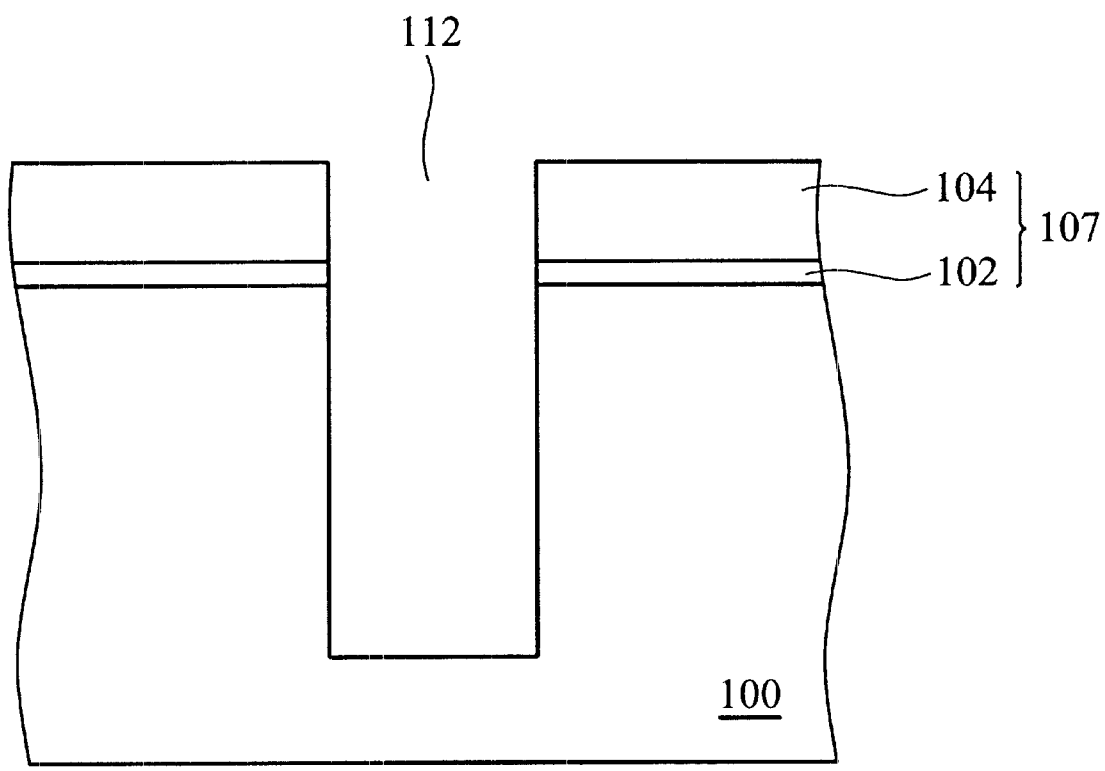
Figure 1C:
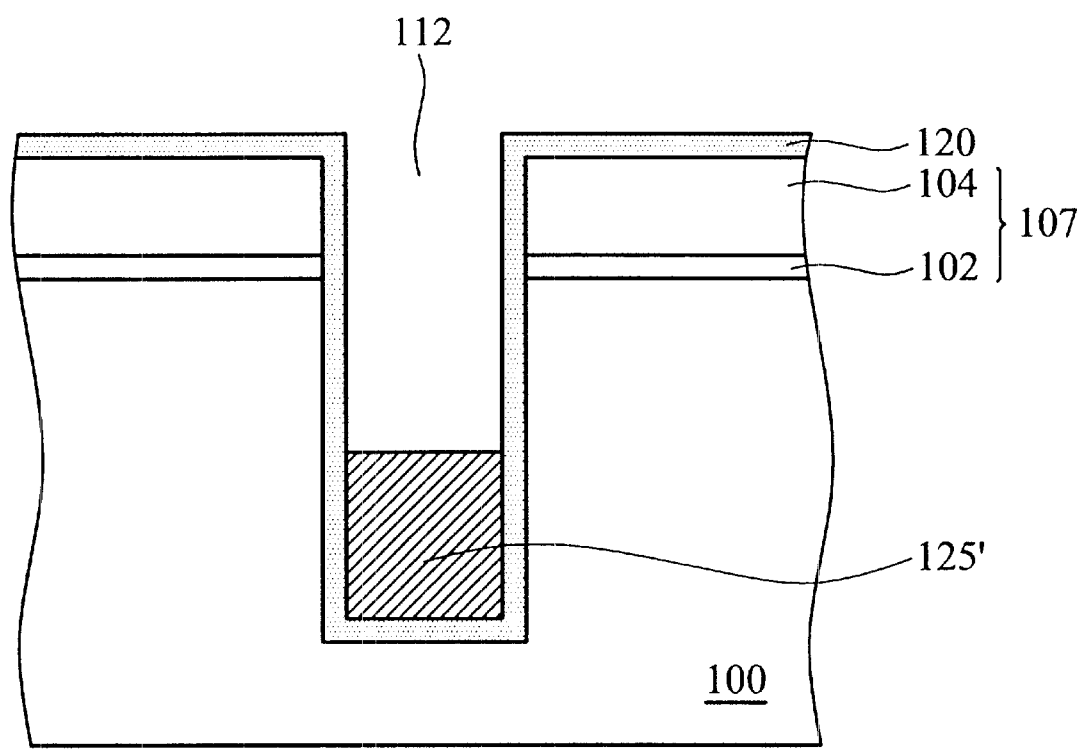
Figure 1D:
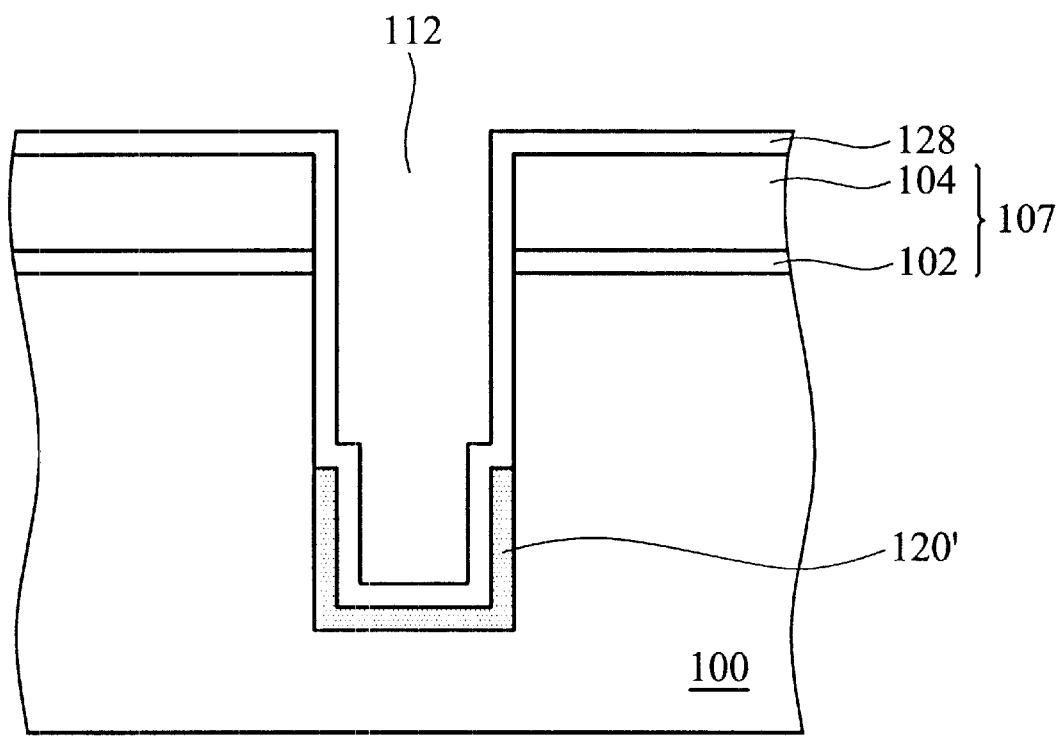
Figure 1E:
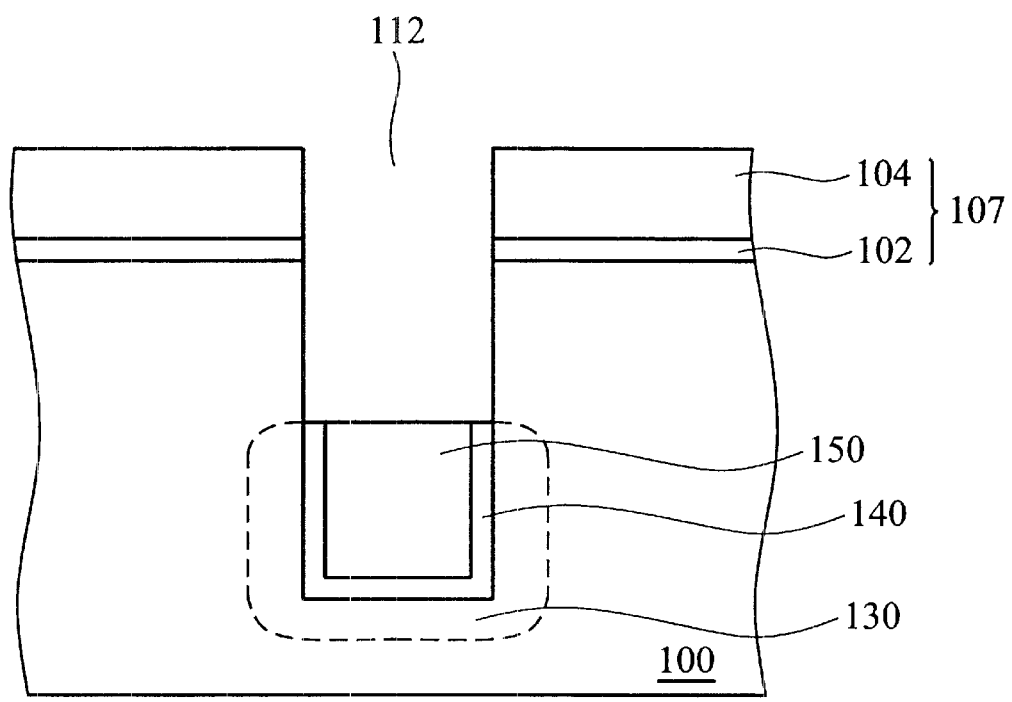
Figure 1F:
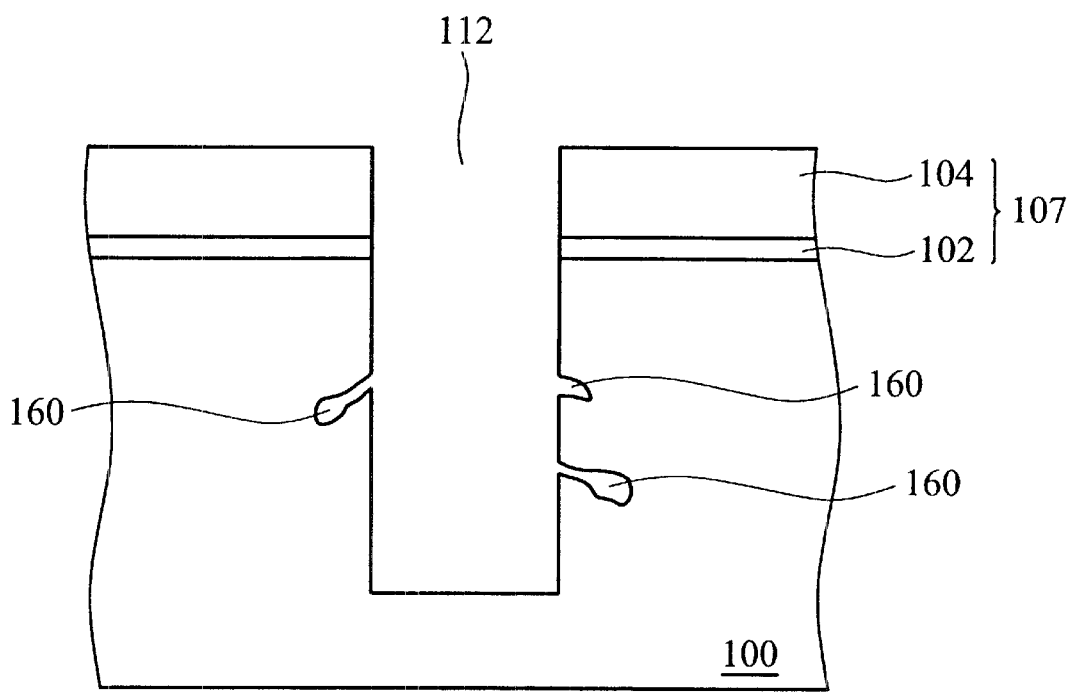
FIG. 1F is a schematic cross-section of sidewall pockets formed by conventional processes.
Figure 2A:
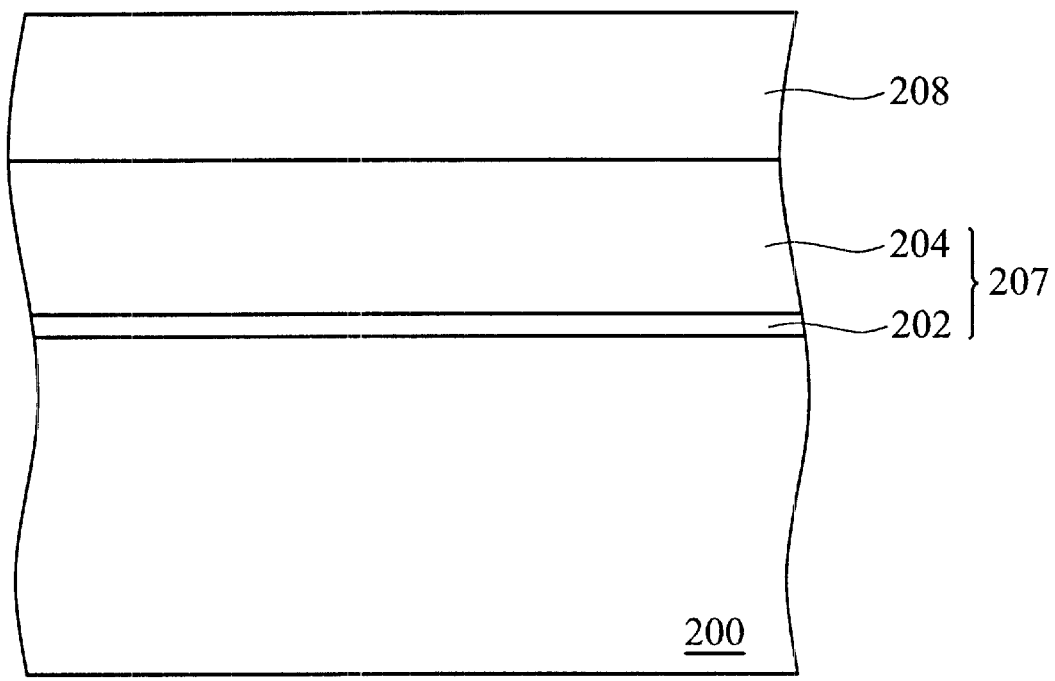
FIGS. 2A to 2G are sectional diagrams showing a method of fabricating a trench capacitor of a DRAM cell according to the present invention.

In FIG. 2A, a semiconductor substrate 200 is provided. The semiconductor substrate 200 is composed of silicon or germanium. The substrate 200 can be epitaxial silicon or silicon on insulator (SOI). For simplicity, a P-type semiconductor silicon substrate 200 is taken as an example in this invention. A pad oxide layer 202 with thickness of about 100 to 600 angstroms is formed on the substrate 200 by oxidation. A pad nitride layer 204 with thickness of about 1600 to 3000 angstroms is then formed on the pad oxide 202 by CVD. The pad oxide 202 and the pad nitride 206 constitute the pad layer 207. A first masking layer 208 such as a boron-silicate glass (BSG) with thickness of about 5000 to 20000 angstroms is formed on the pad layer 207 by CVD. Thereafter, thermal reflow process, etch back process or chemical mechanical polishing (CMP) planarizes the masking layer 208.

Figure 2B:
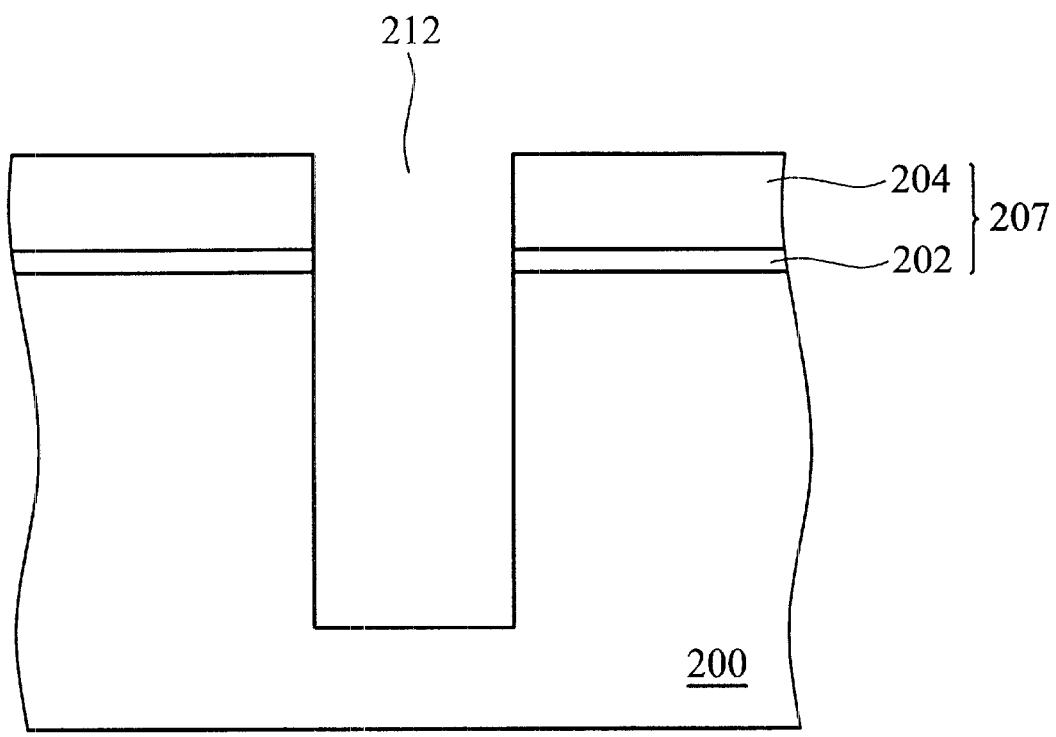

In FIG. 2B, the masking layer 208 is defined by photolithography and etching. Subsequently, the pad layer 207 and the substrate 200 are defined to form a deep trench 212 with depth of about 6 to 7 micron meters on the substrate 200 by anisotropic etching using the masking layer 208 as a mask. After the formation of the deep trench 212, the masking layer 208 is removed by anisotropic etching using the pad layer 207 as an etching stop layer. However, the sidewall of the deep trench 212 is damaged and forms sidewall packets (not shown) because of ion bombardment during the formation of deep trench 212.

Figures 1, 2C:
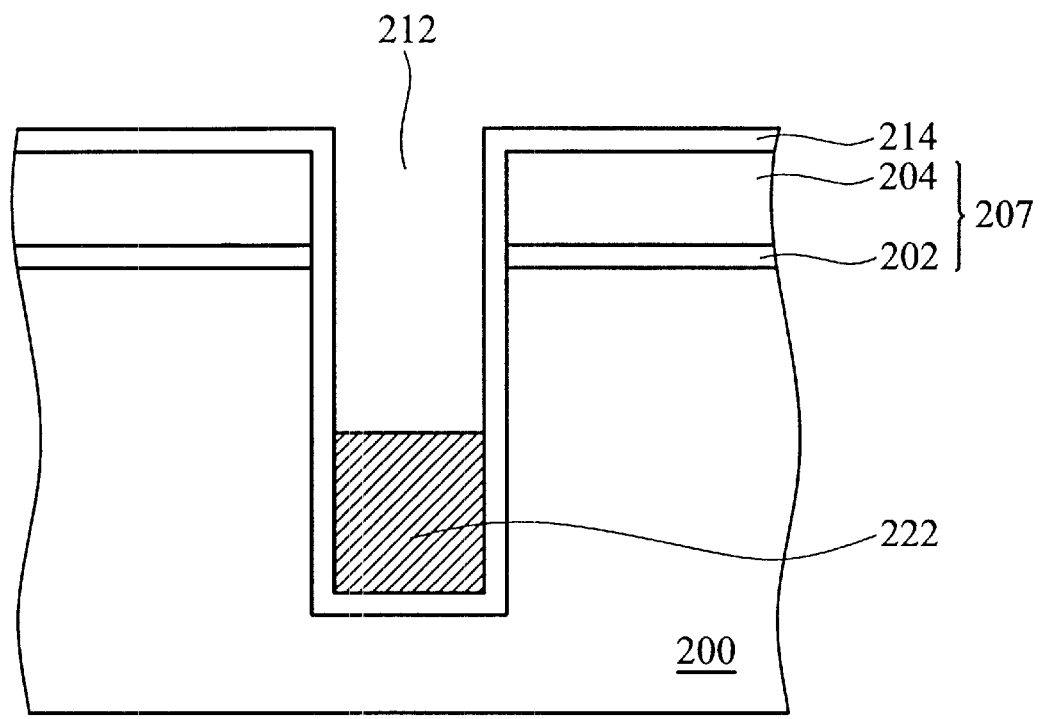
Figures 2, 2C:
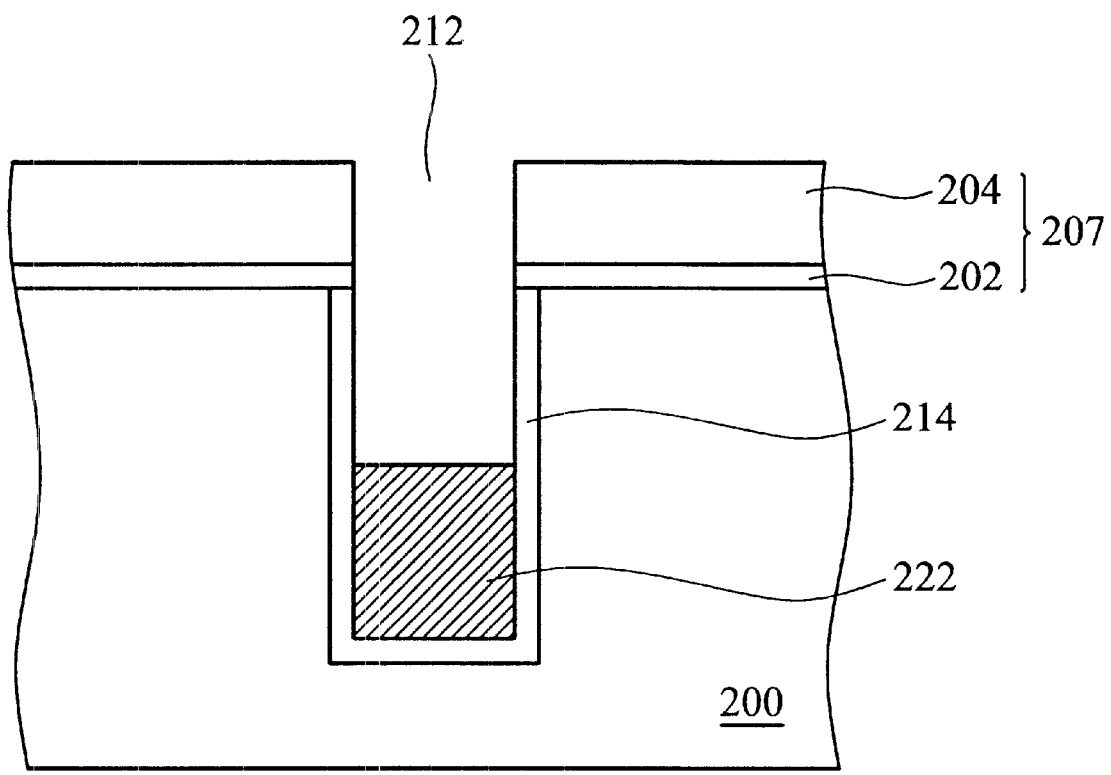

FIG. 2C-1 and FIG. 2C-2 show two ways to form an insulating layer on the sidewall of the deep trench. In FIG.2C-1, a first insulating layer 214 with thickness of 50 to 400 angstroms is conformably formed on the pad layer 207 and the surface of the deep trench 212 by low-pressure CVD (LPCVD). The sidewall pockets (not shown) as mentioned above are filled with the first insulating layer 214. As a result, the formation of the first insulating layer 214 can prevent the current leakage. Subsequently, a first photoresist layer (not shown) is filled into the deep trench 212, and the first photoresist layer is then recessed about 15000 to 20000 angstroms depth below the upper surface of the first insulating layer 214. Thereafter, the remaining first photoresist layer is represented as a residual first photoresist layer 222.

Also, in FIG. 2C-2, a first insulating layer 214 with thickness of 50 to 400 angstroms is conformably formed on the exposed surface of the substrate 200 in the deep trench 212 by oxidation. The first insulating layer 214 recovers the damages and sidewall pockets (not shown) as mentioned above to prevent the current leakage. Subsequently, a first photoresist layer (not shown) is filled into the deep trench 212, and the first photoresist layer is then recessed to about 15000 to 20000 angstroms depth below the upper surface of the first insulating layer 214. Thereafter, the remaining first photoresist layer is represented as a residual first photoresist layer 222.

Figure 2D:
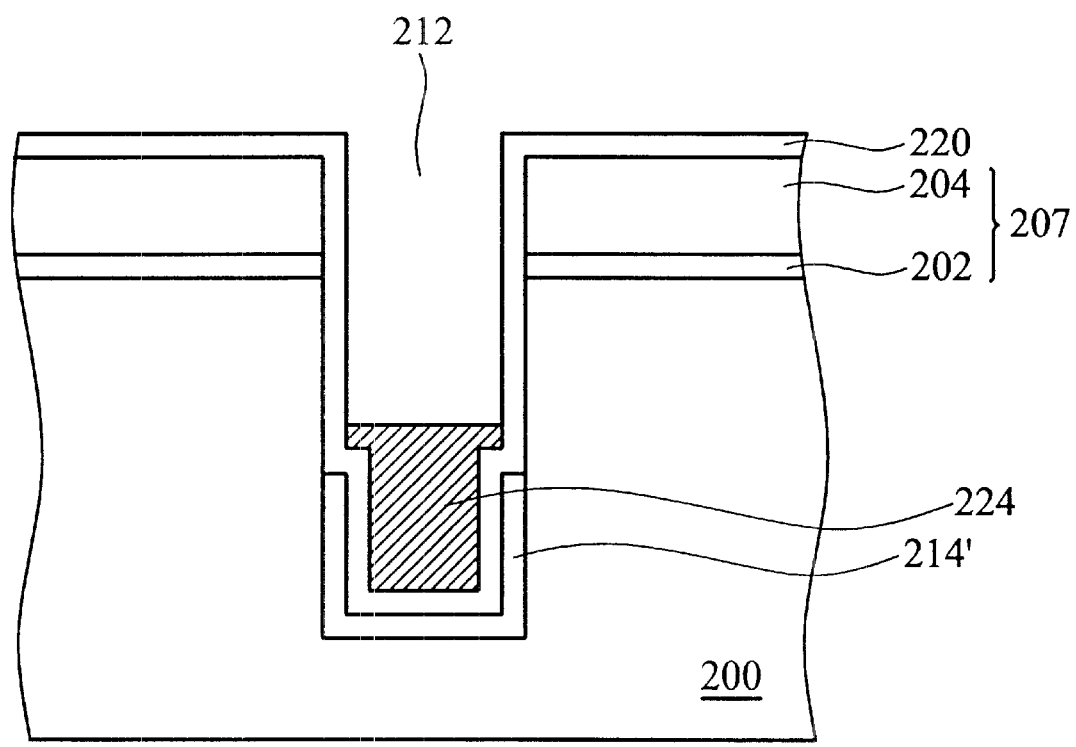
Figures 1, 2D:
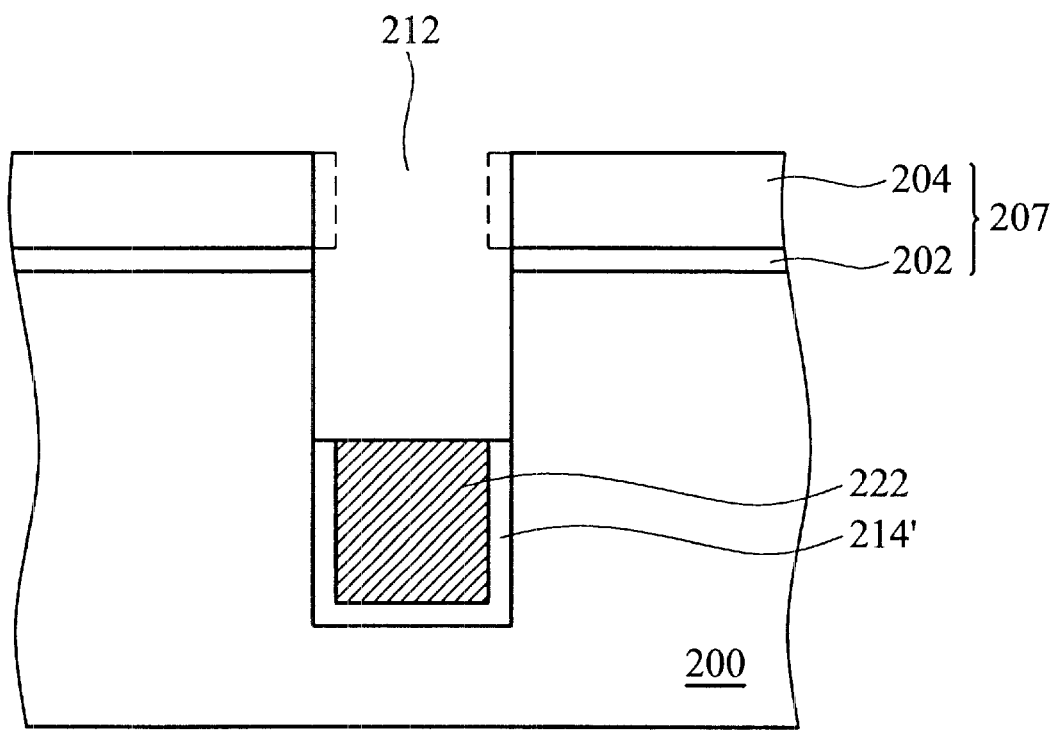

In FIG. 2D, the first insulating layer 214 above the upper surface of the residual first photoresist layer 222 is removed by isotropic etching. The remaining first insulating layer 214 is then represented as the residual first insulating layer 214'. The upper surface of the residual first insulating layer 214' is lower than that of the substrate 200. The residual first photoresist layer 222 is removed. Subsequently, a non-doped layer 220 is conformably formed on the pad layer 207, the exposed surface of the substrate 200 and the surface of the residual first insulating layer 214'. The non-doped layer 220, which has a thickness of about 50 to 1000 angstroms, is usually made of amorphous polycrystalline silicon (e.g. P+ doped polycrystalline silicon), epitaxial silicon or silicon germanium formed by LPCVD. The deep trench 212 is filled with a second photoresist layer (not shown), and the second photoresist layer is then recessed about 15000 to 18000 angstroms depth below the upper surface of the non-doped layer 220. Thereafter, the remaining second photoresist layer is represented as a residual second photoresist layer 224. The upper surface of the residual second photoresist layer 224 is at least 2000 angstroms higher than that of the residual first insulating layer 214'.

In addition, in FIG. 2C-2, the first insulating layer 214 is formed by oxidation. That is, the sidewall and the bottom of the deep trench 212 are oxidized to form the oxide silicon (i.e. first insulating layer 214). After the upper portion of the residual first insulating layer 214' is formed, the diameter of the deep trench 212 becomes wider than that of the opening surround by the pad nitride layer 204, as shown in FIG. 2D-1. In order to adjust the diameter of the opening to be substantially level with that of the deep trench 212, a portion of the pad nitride layer 204 around the opening of the deep trench 212 with width of about 50 to 400 angstroms is removed by anisotropic etching (not shown) after the formation of the residual first insulating layer 214'. However, in FIG. 2C-1, the first insulating layer 212 is formed by LPCVD or atmospheric pressure CVD (APCVD), thus no etching is needed for the pad layer 207 to adjust the diameter of the opening.

Figure 2E:
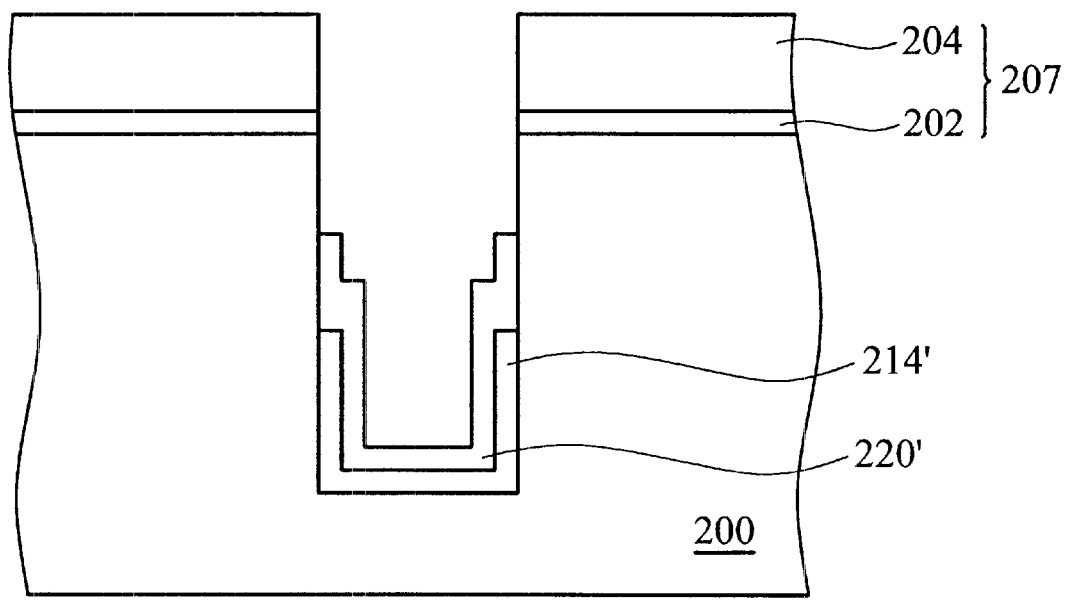

In FIG. 2E, the portion of the non-doped layer 220 higher than the upper surface of the residual second photoresist layer 224 is removed by isotropic etching. Thereafter, the remaining non-doped layer 220 is represented as a residual non-doped layer 220', and the upper surface of residual non-doped layer 220' is at least 2000 angstroms higher than that of the residual first insulating layer 214'. That is, the upper surface of the residual non-doped layer 220' is between the upper surfaces of the residual first insulating layer 214' and the substrate 200. The second photoresist layer 224 is then removed.

Figure 2F:
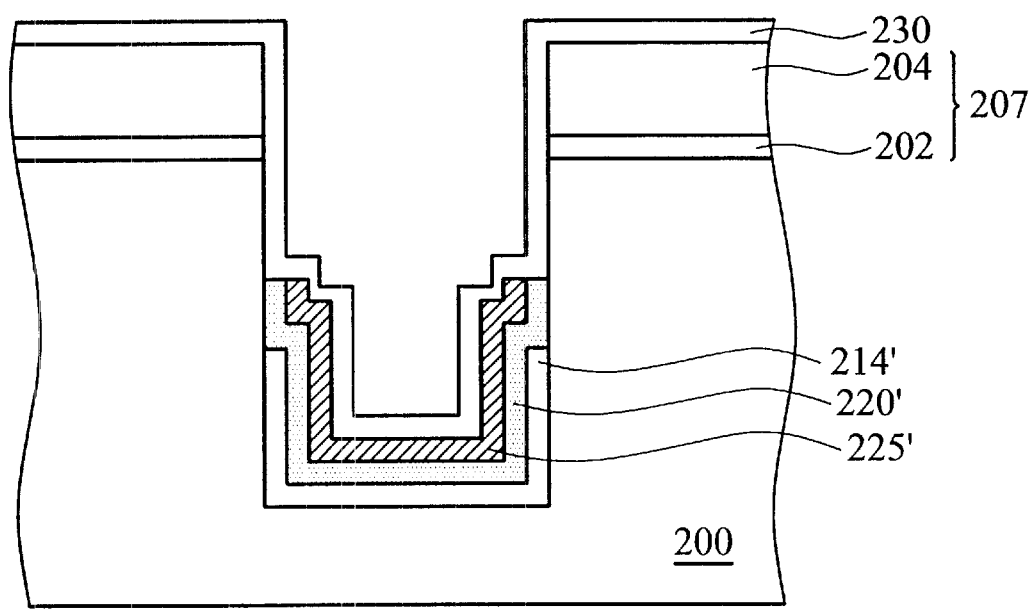

In FIG. 2F, a doped insulating layer 225 with thickness of about 50 to 500 angstroms is conformably formed on the pad layer 207, the exposed surface of the substrate 200 and the surface of the residual non-doped layer 220'. The doped insulating 225 can be made of phosphosilicate glass (PSG) or ASG formed by CVD, APCVD, subatmopheric pressure CVD (SAPCVD), LPCVD, plasma-enhanced CVD (PECVD) or high-density plasma CVD (HDPCVD). Subsequently, the deep trench 212 is filled with a third photoresist layer (not shown). The upper portion of the third photoresist layer above the residual non-doped layer 220' is removed, and the upper surface of the residual third photoresist layer is substantially level with that of the residual non-doped layer 220'. Afterwards, the doped insulating layer 225 above the residual third photoresist layer is removed by anisotropic etching. Thereafter, the remaining doped insulating layer 225 is represented as a residual doped insulating layer 225'. That is, the upper surface of the residual doped insulating layer 225' is substantially level with that of the residual non-doped layer 220'. The residual third photoresist layer is then removed. A second insulating layer 230 with thickness of about 50 to 500 angstroms is conformably formed on the pad layer 207, the exposed surfaces of the substrate 200 and the residual non-doped layer 220' and the surface of the residual doped insulating layer 225' by CVD, APCVD, LPCVD, APCVD, PECVD or HDPCVD. The second insulating layer 230 can be made of non-doped silicate glass (NSG), high-density Plasma oxide (HDP oxide) or TEOS oxide.

Figure 2G:
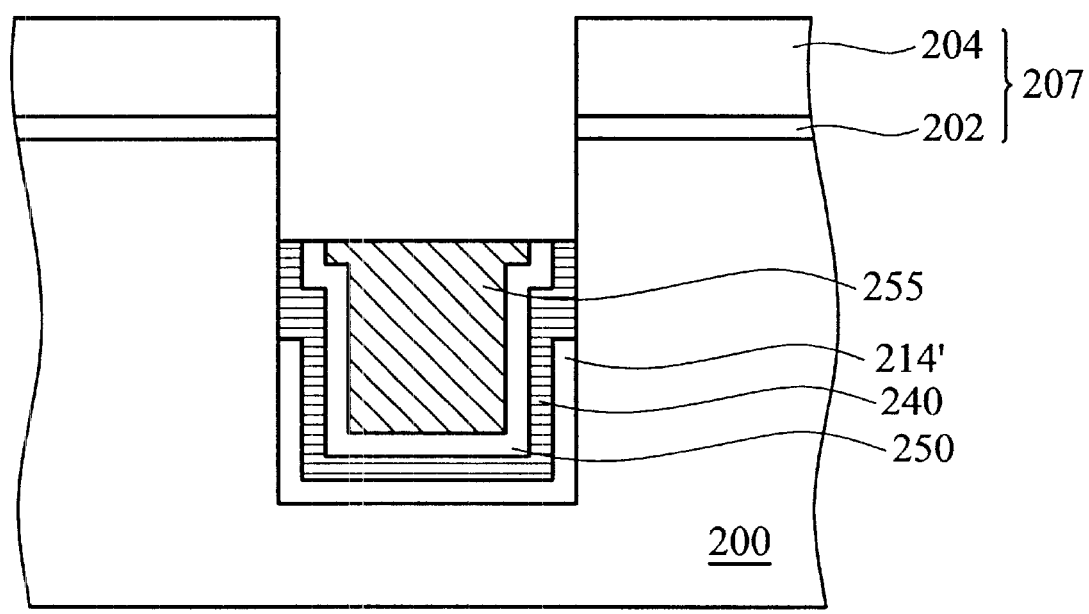

In FIG. 2G, the phosphorus ions or the arsenic ions in the residual doped insulating layer 225' are driven into the residual non-doped layer 220' by a drive-in process. The residual non-doped layer 220' becomes a bottom electrode 240 of a capacitor after the drive-in process is performed. The residual doped insulating layer 225' and the second insulating layer 230 are then removed in sequence by anisotropic etching. Thereafter, a capacitor dielectric layer 250 is conformably formed on the sidewall and bottom of the bottom electrode 240. This layer 250 is typically composed of layers of $Si_3N_4/SiO_2$ (NO), or layers of $SiO_2/Si_3N_4/SiO_2$ (ONO) or only a layer of Tantalum oxide or other high k dielectric materials ($HfO_2$, $Al_2O_3$, $ZrO_2$). A conductive layer (not shown) such as a polycrystalline silicon in-situ doped with arsenic ions or phosphorus ions is formed on the pad layer 207 and in the deep trench 212. Subsequently, the portion of the conductive layer above the upper surface of the capacitor dielectric layer 250 is removed to form a top electrode 255 of a capacitor by etching back using the capacitor dielectric layer 250 as an etch stop layer. That is, the upper surface of the top electrode 255 is substantially equal to the upper surface of the dielectric layer 250 or the bottom electrode 240. The fabrication of a trench capacitor of a memory cell is completed.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating the trench capacitor of a memory cell, comprising steps of:

providing a semiconductor substrate with a surface covered by a pad layer;

forming a trench in the substrate;

forming a first insulating layer on the pad layer and the surface of the trench conformably;

removing a portion of the first insulating layer to form a residual first insulating layer, wherein the upper surface of the residual first insulating layer is lower than that of the substrate;

forming a non-doped layer on the pad layer, the exposed surface of the substrate and the surface of the residual first insulating layer conformably;

removing a portion of the non-doped layer to form a residual non-doped layer, wherein the upper surface of the residual non-doped layer is between the upper surfaces of the residual first insulating layer and the substrate;

forming a doped insulating layer on the pad layer, the exposed surface of the substrate and the surface of the residual non-doped layer conformably;

removing a portion of the doped insulating layer to form a residual doped insulating layer, wherein the upper surface of the residual doped insulating layer is substantially level with that of the residual non-doped layer;

forming a second insulating layer on the pad layer, the exposed surfaces of the substrate and the residual non-doped layer and the surface of the residual doped layer conformably;

performing a drive-in process to drive the ions in the residual doped insulating layer into the residual non-doped layer to form a bottom electrode;

removing the residual doped insulating layer and the second insulating in sequence;

forming a dielectric layer on the sidewall and bottom of the bottom electrode conformably;

forming a conductive layer on the pad layer and in the trench; and removing a portion of the conductive layer to form a top electrode, wherein the upper surface of the top electrode is substantially level with that of the dielectric layer.

2. The method of claim 1, wherein the semiconductor substrate is silicon.

3. The method of claim 1, wherein the pad layer is composed of a pad nitride layer and a pad oxide layer.

4. The method of claim 1, wherein the first insulating layer is silicon oxide formed by LPCVD.

5. The method of claim 1, wherein the first insulating layer is silicon nitride.

6. The method of claim 1, wherein the thickness of the first insulating layer is 50 to 400 angstroms.

7. The method of claim 1, wherein the non-doped layer is amorphous silicon, epitaxial silicon, or silicon germanium.

8. The method of claim 1, wherein the thickness of the non-doped layer is 50 to 1000 angstroms.

9. The method of claim 1, wherein the doped insulating layer is ASG.

10. The method of claim 1, wherein the thickness of the doped insulating layer has a about 50 to 500 angstroms.

11. The method of claim 1, wherein the second insulating layer is non-doped silicate glass (NSG), high density Plasma oxide (HDP oxide) or TEOS oxide.

12. The method of claim 1, wherein the thickness of the second insulating layer is 50 to 500 angstroms.

13. A method of fabricating the trench capacitor of a memory cell, comprising steps of:

providing a semiconductor substrate with a surface covered by a pad layer, wherein the pad layer is composed of a pad nitride layer and a pad oxide layer;

forming a trench in the substrate;

forming a first insulating layer on the surface of the trench conformably;

removing a portion of the first insulating layer to form a residual first insulating layer, wherein the upper surface of the residual first insulating layer is lower than that of the substrate;

removing a portion of the pad nitride layer around the opening of the trench to make the diameter of the opening substantially level with that of the trench;

forming a non-doped layer on the pad layer, the exposed surface of the substrate and the surface of the residual first insulating layer conformably;

removing a portion of the non-doped layer to form a residual non-doped layer, wherein the upper surface of the residual non-doped layer is between the upper surfaces of the residual first insulating layer and the substrate;

forming a doped insulating layer on the pad layer, the exposed surface of the substrate and the surface of the residual non-doped layer conformably;

removing a portion of the doped insulating layer to form a residual doped insulating layer, wherein the upper surface of the residual doped insulating layer is substantially equal to that of the residual non-doped layer;

forming a second insulating layer on the pad layer, the exposed surfaces of the substrate and the residual non-doped layer and the surface of the residual doped layer;

performing a drive-in process to drive the ions in the residual doped insulating layer into the residual non-doped layer to form a bottom electrode;

removing the residual doped insulating layer and the second insulating in sequence;

forming a capacitor dielectric layer on the sidewall and bottom of the bottom electrode conformably;

forming a conductive layer on the pad layer and in the trench; and removing a portion of the conductive layer to form a top electrode, wherein the upper surface of the top electrode is substantially level with that of the capacitor dielectric layer.

14. The method of claim 13, wherein the semiconductor substrate is silicon.

15. The method of claim 13, wherein the first insulating layer is silicon oxide formed by oxidation.

16. The method of claim 13, wherein the thickness of the first insulating layer is 50 to 400 angstroms.

17. The method of claim 13, wherein the non-doped layer is amorphous silicon, epitaxial silicon, or silicon germanium.

18. The method of claim 13, wherein the thickness of the non-doped layer is 50 to 1000 angstroms.

19. The method of claim 13, wherein the doped insulating layer is ASG.

20. The method of claim 13, wherein the thickness of the doped insulating layer is 50 to 500 angstroms.

21. The method of claim 13, wherein the second insulating layer is non-doped silicate glass (NSG), high density Plasma oxide (HDP oxide) or TEOS oxide.

22. The method of claim 13, wherein the thickness of the second insulating layer is 50 to 500 angstroms.

* * * * *